US 9,633,301 B2

(12) United States Patent
Mizoguchi et al.

(10) Patent No.: US 9,633,301 B2
(45) Date of Patent: Apr. 25, 2017

(54) IC MODULE, DUAL IC CARD, AND METHOD FOR MANUFACTURING IC MODULE

(71) Applicant: Toppan Printing Co., Ltd., Taito-ku, Tokyo (JP)

(72) Inventors: Shonosuke Mizoguchi, Tokyo (JP); Tetsuya Tsukada, Tokyo (JP); Eriko Hatakeyama, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/973,457

(22) Filed: Dec. 17, 2015

(65) Prior Publication Data

US 2016/0104064 A1    Apr. 14, 2016

Related U.S. Application Data

(63) Continuation of application No. PCT/JP2014/066656, filed on Jun. 24, 2014.

(30) Foreign Application Priority Data

Jun. 25, 2013 (JP) ................................. 2013-132898

(51) Int. Cl.
*H05K 1/14* (2006.01)
*G06K 19/077* (2006.01)
(Continued)

(52) U.S. Cl.
CPC . *G06K 19/07747* (2013.01); *G06K 19/07775* (2013.01); *G06K 19/07779* (2013.01);
(Continued)

(58) Field of Classification Search
CPC ........ G06K 19/07747; G06K 19/07779; H01L 21/486; H01L 21/56; H01L 23/3107;
(Continued)

(56) References Cited

U.S. PATENT DOCUMENTS 4,962,415 A * 10/1990 Yamamoto ....... G06K 19/07728
235/487
4,990,759 A *  2/1991 Gloton ............. G06K 19/07728
235/487
(Continued)

FOREIGN PATENT DOCUMENTS

JP    11-149536 A    6/1999
JP   2009-075782 A   4/2009
(Continued)

OTHER PUBLICATIONS

International Search Report issued in PCT/JP2014/066656 dated Sep. 30, 2014.

*Primary Examiner* — Hung S Bui
(74) *Attorney, Agent, or Firm* — Foley & Lardner LLP

(57) ABSTRACT

An IC module of the present invention includes: a sheet-like base having a first surface and a second surface and having a first through hole and a second through hole spaced apart from the first through hole; an IC chip provided to the first surface, having a contact communication function and a contactless communication function, and having two terminals formed thereon; a connecting coil formed on the first surface and having two ends; a contact terminal portion provided to the second surface and configured to contact an external contact machine; bridge wiring provided to the second surface, provided at a position overlapping with the first and second through holes, and electrically insulated from the contact terminal portion; a first conductive wire inserted through the first through hole and connecting the first terminal of the IC chip to the bridge wiring; a second conductive wire inserted through the second through hole and connecting the bridge wiring to the first end of the
(Continued)

connecting coil; and a third conductive wire connecting the second end of the connecting coil to the second terminal of the IC chip.

7 Claims, 8 Drawing Sheets

(51) Int. Cl.
  *H01L 21/48* (2006.01)
  *H01L 21/56* (2006.01)
  *H01L 23/31* (2006.01)
  *H01L 23/498* (2006.01)
  *H01L 23/522* (2006.01)
  *H01L 23/00* (2006.01)

(52) U.S. Cl.
  CPC ............ *H01L 21/486* (2013.01); *H01L 21/56* (2013.01); *H01L 23/3107* (2013.01); *H01L 23/49827* (2013.01); *H01L 23/49855* (2013.01); *H01L 23/5227* (2013.01); *H01L 24/43* (2013.01); *H01L 24/49* (2013.01); *H01L 24/85* (2013.01); *H01L 24/45* (2013.01); *H01L 2224/05554* (2013.01); *H01L 2224/45144* (2013.01); *H01L 2224/45147* (2013.01); *H01L 2224/4813* (2013.01); *H01L 2224/48225* (2013.01); *H01L 2924/14* (2013.01); *H01L 2924/181* (2013.01)

(58) Field of Classification Search
  CPC ... H01L 23/49827; H01L 23/43; H01L 24/49; H01L 2224/45144; H01L 2224/4813; H01L 2924/14
  USPC ........................................................ 361/737
  See application file for complete search history.

(56) References Cited

U.S. PATENT DOCUMENTS 5,640,306 A * 6/1997 Gaumet ............ G06K 19/07749
                                                  174/528
7,777,317 B2 * 8/2010 Wolny ............. G06K 19/07749
                                                  257/679
8,517,278 B2 * 8/2013 Le Garrec ............ G06K 19/077
                                                  235/379

FOREIGN PATENT DOCUMENTS

| WO | WO-96/35190 | 11/1996 |
| WO | WO-98/15916 | 4/1998 |
| WO | WO-99/26195 | 5/1999 |
| WO | WO-99/26197 A1 | 5/1999 |

* cited by examiner

IC MODULE, DUAL IC CARD, AND METHOD FOR MANUFACTURING IC MODULE

CROSS-REFERENCE TO RELATED PATENT APPLICATIONS

This application is a continuation application filed under 35 U.S.C. 111(a) claiming the benefit under 35 U.S.C. §§ 120 and 365(c) of PCT International Application No. PCT/JP2014/066656 filed on Jun. 24, 2014, which is based upon and claims the benefit of priority of Japanese Application No. 2013-132898, filed on Jun. 25, 2013, the entire contents of them all are hereby incorporated by reference.

TECHNICAL FIELD

The present invention relates to an IC module and a dual IC card which are capable of contact communication and contactless communication, and relates to a method for manufacturing an IC module.

BACKGROUND

IC modules mounting IC chips and having functions of contact communication and contactless communication provide communication modes according to users' various applications. Specifically, such an IC module is mounted to a card body that is capable of power supply and communication by being electromagnetically coupled with the IC module, for use as a dual IC card. Electrical connection between the IC module and the card body by electromagnetic coupling can minimize destabilization of electrical connection between the IC module and the card body. This is because if the IC module and the card body are directly connected by a conductive connecting member, such as solder, the connecting member may be broken when the dual IC card is bent.

As such a dual IC card in which the IC module and the card body are electrically connected by electromagnetic coupling are described, for example, in PTLs 1 through 3.

An IC module for such a dual IC card has a surface on which a terminal used for an interface (contact terminal portion) is formed for contact with an external contact machine, and a rear surface on which a connecting coil is formed for transformer coupling (electromagnetic coupling). The IC module has a base which is subjected to a through-hole plating process to form a bridge (bridge wiring) on the surface of the base, so that the outermost end of the connecting coil is moved to the center of the base. Such a through-hole plating process herein refers to forming a through hole in the base by punching or the like and forming wiring in the through hole by plating or the like.

The terminal on the surface of the base and the IC chip on the rear surface are connected by hole-punching wire bonding, which is a known wire bonding process using a wire inserted through a through hole of a base.

Contact communication dual IC cards are used for applications that need reliability and security, such as large quantities of data exchange by credit-card transactions or communication for account settlement procedures. In contrast, contactless communication dual IC cards are used for applications where communication data volume is small and main communication is authentication, such as gate control for allowing someone to enter or leave a room.

CITATION LIST

Patent Literature

PTL 1: WO 99/26195
PTL 2: WO 98/15916
PTL 3: WO 96/35190

SUMMARY OF THE INVENTION

Technical Problem

However, in the connection method using a through-hole plating process, the base is required to be plated. For this reason, the IC module manufacturing process becomes complicated, which increases the manufacturing cost of the IC module.

The present invention has been made in light of such problems and has an object to provide an IC module that can be manufactured easily at low cost without plating, and to provide a dual IC card having the IC module and a method for manufacturing the IC module.

Solution to Problem

In order to attempt to solve the problems set forth above, the invention proposes the following means.

An IC module according to a first aspect of the present invention includes: a sheet-like base having a first surface and a second surface and having a first through hole and a second through hole spaced apart from the first through hole; an IC chip provided to the first surface, having a contact communication function and a contactless communication function, and having a first terminal and a second terminal formed thereon; a connecting coil formed on the first surface and having a first end and a second end; a contact terminal portion provided to the second surface and configured to contact an external contact machine; bridge wiring provided to the second surface, provided at a position overlapping with the first through hole and the second through hole as viewed in a thickness direction of the base, and electrically insulated from the contact terminal portion; a first conductive wire inserted through the first through hole and connecting the first terminal of the IC chip to the bridge wiring; a second conductive wire inserted through the second through hole and connecting the bridge wiring to the first end of the connecting coil; and a third conductive wire connecting the second end of the connecting coil to the second terminal of the IC chip.

In the first aspect, the IC chip and the contact terminal portion may be connected via an auxiliary conductive wire inserted through an auxiliary through hole formed in the base.

In the first aspect, the module may include a resin seal covering the IC chip, the first conductive wire, the second conductive wire, and the third conductive wire.

A dual IC card according to a second aspect of the present invention includes: the IC module according to the first aspect; and a plate-like card body provided with an antenna having a coupling coil electromagnetically coupled to the connecting coil of the IC module, and a main coil connected to the coupling coil to perform contactless communication with an external contactless machine, the card body having a recess formed therein to accommodate the IC module.

A method for manufacturing an IC module according to a third aspect of the present invention includes: preparing a sheet-like base having a first surface and a second surface;

forming a connecting coil on the first surface; forming, in the base, a first through hole and a second through hole spaced apart from each other; forming, on the second surface, a contact terminal portion configured to contact an external contact machine; forming, on the second surface, bridge wiring electrically insulated from the contact terminal portion, the bridge wiring overlapping with the first through hole and the second through hole as viewed in a thickness direction of the base; mounting, on the first surface of the base, an IC chip having a contact communication function and a contactless communication function; connecting the first terminal of the IC chip to the bridge wiring via a first conductive wire inserted through the first through hole; connecting the bridge wiring to a first end of the connecting coil via a second conductive wire inserted through the second through hole; and connecting a second end of the connecting coil to the second terminal of the IC chip via a third conductive wire.

In the third aspect, the method may include: forming an auxiliary through hole in the base; and connecting the IC chip to the contact terminal portion via an auxiliary conductive wire inserted through the auxiliary through hole.

In the third aspect, the method may include covering the IC chip, the first conductive wire, the second conductive wire, and the third conductive wire with a resin seal.

Advantageous Effects of the Invention

According to the IC module, the dual IC card, and the method for manufacturing an IC module related to the above aspects, an IC module and a dual IC card can be easily manufactured at low cost without performing a through-hole plating process.

DESCRIPTION OF EMBODIMENTS

With reference to FIGS. 1 to 15, a dual IC card according to an embodiment of the present invention will be described.

Figure 1:
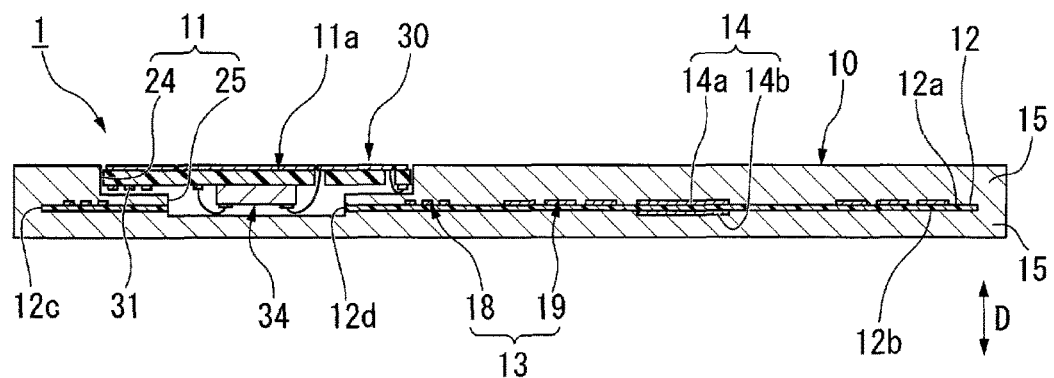
FIG. 1 is a schematic cross-sectional view illustrating a side face of a dual IC card according to an embodiment of the present invention.
Figure 2:
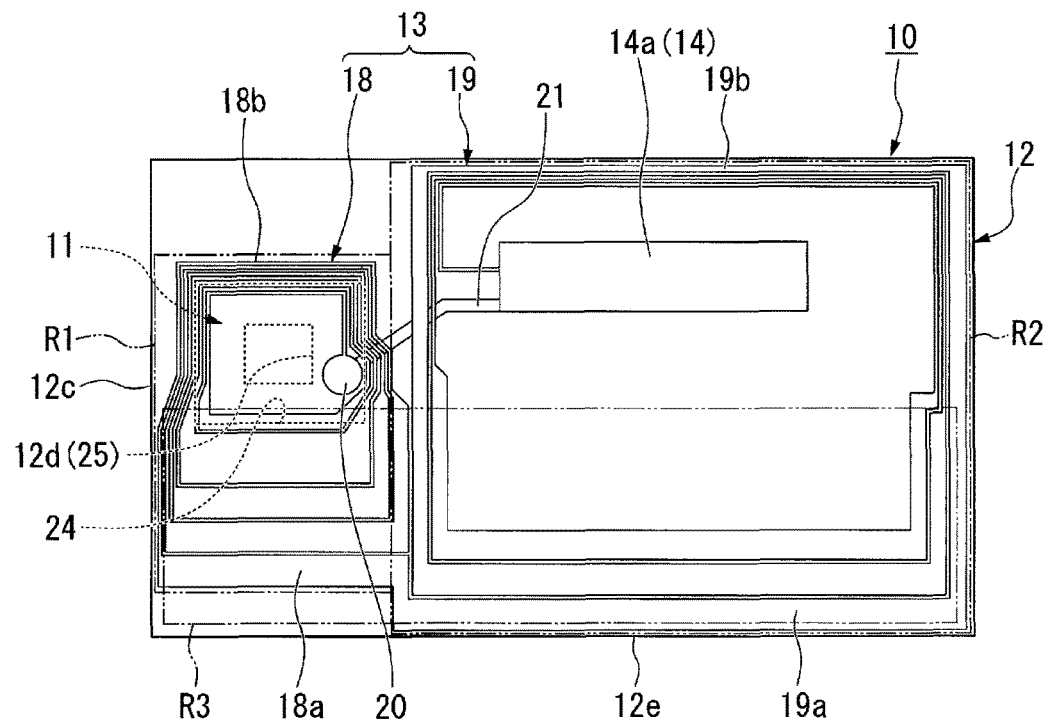
FIG. 2 is a partially transparent plan view illustrating a card body of the dual IC card according to the embodiment of the present invention.

As illustrated in FIGS. 1 and 2, a dual IC card 1 is provided with a plate-like card body 10 having a recess 11 formed therein, and an IC module 30 accommodated in the recess 11.

FIG. 1 is a schematic cross-sectional view illustrating the dual IC card 1 in which the number of times of looping an antenna 13 described later is indicated being simplified. FIG. 2 illustrates the antenna 13 and a capacitive element 14 in the card body 10 in a transparent manner with only the outline of a substrate 12 being shown.

The card body 10 includes the substrate 12, the antenna 13 provided on a first surface 12a in which an opening 11a of the recess 11 of the substrate 12 is formed, the capacitive element 14 connected (electrically connected) to the antenna 13, and a pair of card bases 15 sandwiching therebetween the substrate 12, the antenna 13, and the capacitive element 14.

The substrate 12 is formed into a rectangular shape as viewed perpendicularly from above, using an insulating material, such as PET (polyethylene terephthalate) or polyethylene naphthalate (PEN) (see FIG. 2). Each of the card bases 15 is also formed into a rectangular shape as viewed perpendicularly from above.

At a position closer to a short side 12c of the substrate 12 (than to the center), that is, in a position closer to a short side of the card bases 15, an accommodation hole 12d is formed through the substrate 12 in a thickness direction D thereof. The accommodation hole 12d is formed into a rectangular shape, with its sides being parallel to the short and long sides of the substrate 12 as viewed perpendicularly from above. For example, the substrate 12 has a thickness of 15 to 50 μm (micrometers).

The antenna 13 includes a coupling coil 18 to be electromagnetically coupled to a connecting coil 31, described later, of the IC module 30, and a main coil 19 connected to the coupling coil 18 to achieve contactless communication with an external contactless machine (not shown), such as a reader/writer. The coupling coil 18 is located in a region R1 in FIG. 2, and the main coil 19 is located in a region R2 adjacent to the region R1. At a position closer to a long side 12e of the substrate 12 than to the accommodation hole 12d (i.e. than to the center), that is, near the long side of the card bases 15, there is an embossed region R3 where an emboss can be provided, in conformity with a standard for IC cards (X 6302-1: 2005 (ISO/I EC 7811-1: 2002)).

In this example, the coupling coil 18 is formed into a helical shape, being looped five times around the accommodation hole 12d. The embossed region R3 is provided with a wire 18a configuring the coupling coil 18 and having a width larger than that of a wire 18b located outside the embossed region R3. The wire 18b has an end located innermost of the coupling coil 18. The innermost end is provided with a terminal portion 20 having a width larger than that of the wire 18b and formed into a substantially circular shape. The terminal portion 20 is formed on the first surface 12a.

The main coil 19 is formed into a helical shape, being looped three times in the region R2. The main coil 19 located in the embossed region R3 is configured by a wire 19a having a width larger than that of a wire 19b outside the embossed region R3. Since the widths of the wire 19a and the above wire 18a are made larger, the wires 18a and 19a are prevented from being disconnected when an emboss is provided to the embossed region R3.

The wire 19a has an end located outermost of the main coil 19. The outermost end is connected to an end of the wire 18a, the end being located outermost of the coupling coil 18.

The coupling coil 18 and the main coil 19 are formed by etching a copper foil or an aluminum foil into a pattern. The coupling coil 18 and the main coil 19 have a thickness, for example, of 5 to 50 µm.

As illustrated in FIGS. 1 and 2, the capacitive element 14 includes an electrode plate 14a provided on the first surface 12a of the substrate 12 and an electrode plate 14b provided on a second surface 12b of the substrate 12. The electrode plates 14a and 14b are arranged so as to face each other sandwiching the substrate 12.

The electrode plate 14a is connected to an end located innermost of the wire 19b of the main coil 19.

To the electrode plate 14b, connecting wiring 21 provided on the second surface 12b is connected. The connecting wiring 21 extends to a portion facing the terminal portion 20 located on the second surface 12b of the substrate 12, the portion being provided with a terminal portion, not shown. The terminal portion 20 of the coupling coil 18 and the terminal portion of the connecting wiring 21 are electrically connected by performing a known crimping process. The capacitive element 14 is connected in series between the coupling coil 18 and the main coil 19.

The card bases 15 are formed of an insulating and durable material. Materials that can be used for the bases include polyester-based materials such as amorphous polyester, vinyl chloride-based materials such as PVC (polyvinyl chloride), polycarbonate-based materials, and PET-G (polyethylene terephthalate copolymer).

As illustrated in FIG. 1, the recess 11 is formed in the card bases 15. The recess 11 has a first accommodation portion 24 formed in a side face of the card base 15, and a second accommodation portion 25 formed in the bottom surface of the first accommodation portion 24 and having a diameter smaller than that of the first accommodation portion 24. The first accommodation portion 24 has an opening positioned on the side face of the card base 15, the opening being the opening 11a mentioned above.

Figure 3:
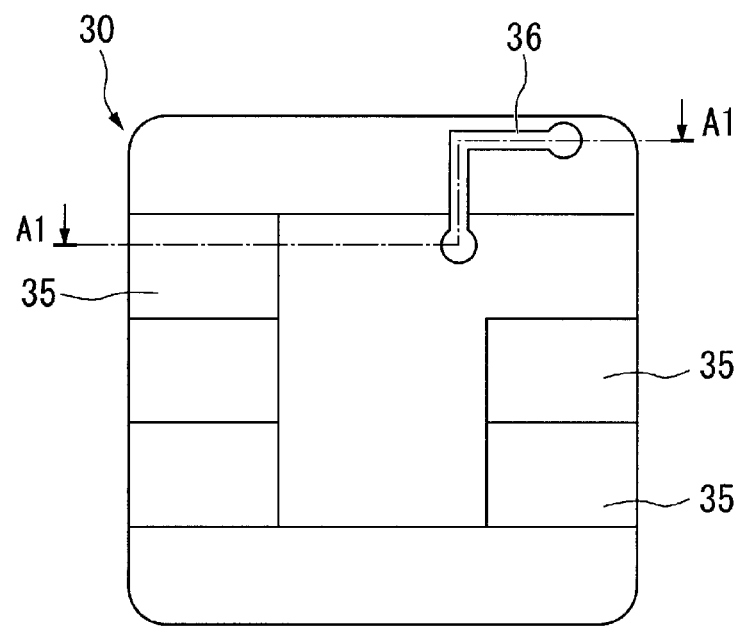
FIG. 3 is a plan view illustrating an IC module of the dual IC card according to the embodiment of the present invention.
Figure 4:
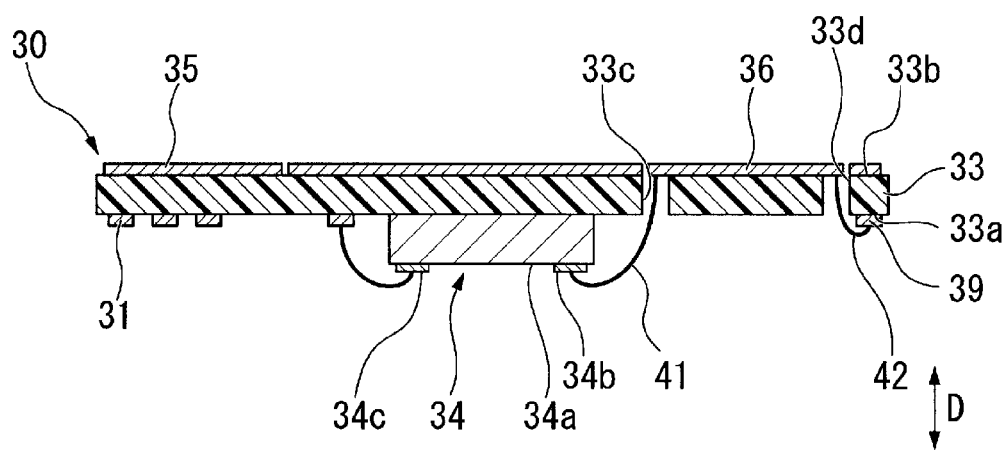
FIG. 4 is a cross-sectional view taken along a line A1-A1 of FIG. 3.
Figure 5:
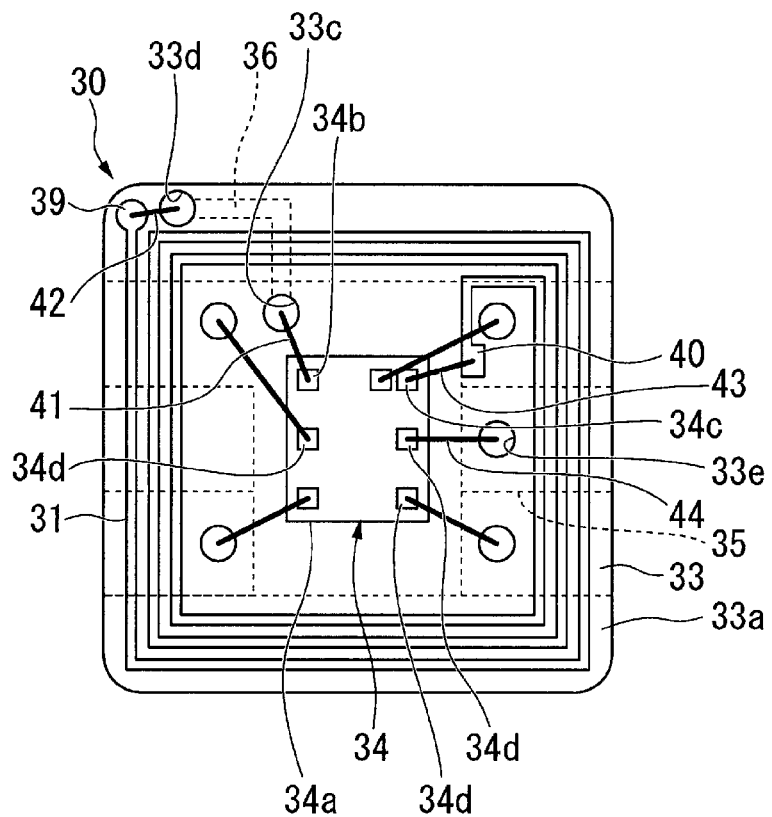
FIG. 5 is a bottom view illustrating the IC module according to the embodiment of the present invention.

As illustrated in FIGS. 3 to 5, the IC module 30 is provided with a sheet-like module base (base) 33, an IC chip 34 and the connecting coil 31 which are provided on a first surface 33a of the module base 33, a plurality of contact terminals (contact terminal portions) 35 and a bridge (bridge wiring) 36 provided on a second surface 33b of the module base 33.

The module base 33 is formed into a rectangular shape, as viewed perpendicularly from above, using the same material as that of the substrate 12. In the module base 33, a first through hole 33c and a second through hole 33d are formed, being spaced apart from each other and being positioned overlapping with the bridge 36 as viewed in a thickness direction D. The thickness direction of the module base 33 coincides with the thickness direction D of the substrate 12 mentioned above. In the module base 33, through holes (auxiliary through holes) 33e are formed, besides the through holes 33c and 33d. For example, the module base 33 has a thickness of 50 to 200 µm.

As the IC chip 34, an IC chip having a known configuration with a contact communication function and a contactless communication function may be used. The IC chip 34 has a chip body 34a whose outer surface is formed with a first terminal 34b, a second terminal 34c, and a plurality of connection terminals 34d.

The connecting coil 31 is formed into a helical shape. The connecting coil 31 is looped three times around the IC chip 34 and the through holes 33c and 33e. The second through hole 33d is formed outside the connecting coil 31. The connecting coil 31 has a wire end (first end) located outermost and a wire end (second end) located innermost, the wire ends being provided with terminal portions 39 and 40, respectively, which are each formed so as to have a width larger than that of the wire. The connecting coil 31 is formed by etching a copper foil or an aluminum foil into a pattern. For example, the connecting coil 31 has a thickness of 5 to 50 µm. The connecting coil 31 configures a contactless terminal portion by electromagnetic coupling with the coupling coil 18 of the card body 10.

The connecting coil 31 formed into a helical shape may be configured with a one-loop coil or may be configured with a helical coil which is looped several times (a plurality of times of looping).

The plurality of contact terminals 35 and the bridge 36 are formed into a predetermined pattern by laminating a copper foil, for example, on the second surface 33b of the module base 33. The bridge 36 is formed into an L shape across the connecting coil 31 as viewed in the thickness direction D (see FIG. 5).

The plurality of contact terminals 35 and the bridge 36 are electrically insulated from each other. The area exposed to the outside in the copper foil may be provided with a nickel layer having a thickness of 0.5 to 3 µm by plating and may further be provided with a gold layer having a thickness of 0.01 to 0.3 µm on the nickel layer by plating.

The contact terminals 35 are brought into contact with an external contact machine, such as an automatic teller machine. The contact terminals 35 are connected to elements and the like, not shown, built in the chip body 34a of the IC chip 34.

The plurality of contact terminals may be formed on the second surface 33b of the module base 33 using a lead frame having a thickness of 50 to 200 µm, and the connecting coil may be formed on the first surface 33a of the module base 33 using a copper wire.

The first terminal 34b of the IC chip 34 and the bridge 36 are connected via a first wire (first conductive wire) 41 which is inserted through the first through hole 33c. The bridge 36 and the terminal portion 39 of the connecting coil 31 are connected via a second wire (second conductive wire) 42 which is inserted through the second through hole 33d. The terminal portion 40 of the connecting coil 31 and the second terminal 34c of the IC chip 34 are connected via a third wire (third conductive wire) 43.

In this example, the connection terminals 34d of the IC chip 34 and the contact terminals 35 are connected via respective connecting wires (auxiliary conductive wires) 44 that are inserted through the through holes 33e. The wires 41, 42, and 43 and the connecting wires 44 are formed of gold or copper and each have an outer diameter of 10 to 40 μm, for example.

Thus, a closed circuit is configured by the IC chip 34, the connecting coil 31, the bridge 36, and the wires 41, 42, 43, and 44.

In connecting the first terminal 34b of the IC chip 34 to the bridge 36 and in connecting the bridge 36 to the connecting coil 31, hole-punching wire bonding is performed by using the wires 41 and 42.

In connecting the connection terminals 34d of the IC chip 34 to the contact terminals 35 as well, hole-punching wire bonding is performed using the connecting wires 44. When the connecting coil 31 is connected to the second terminal 34c of the IC chip 34, wire bonding is performed using the third wire 43.

Figure 6:
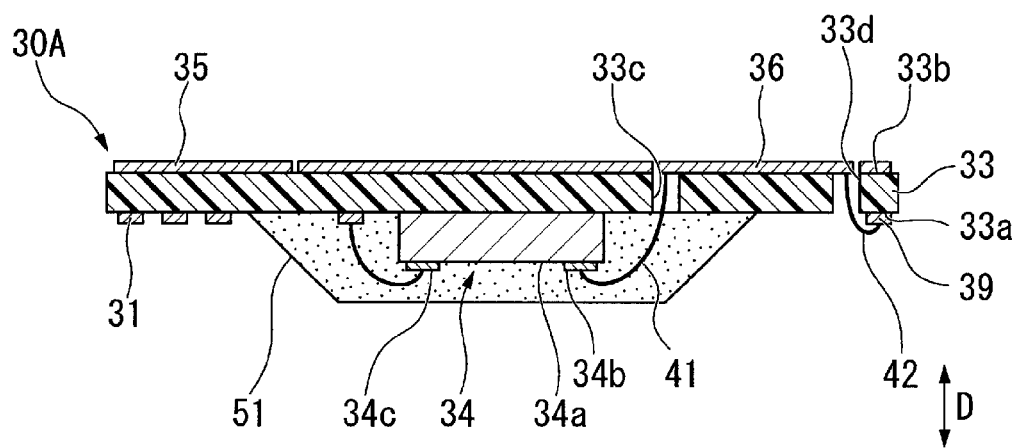
FIG. 6 is a cross-sectional view illustrating a side face of a dual IC card according to a first modification of the embodiment of the present invention.
Figure 7:
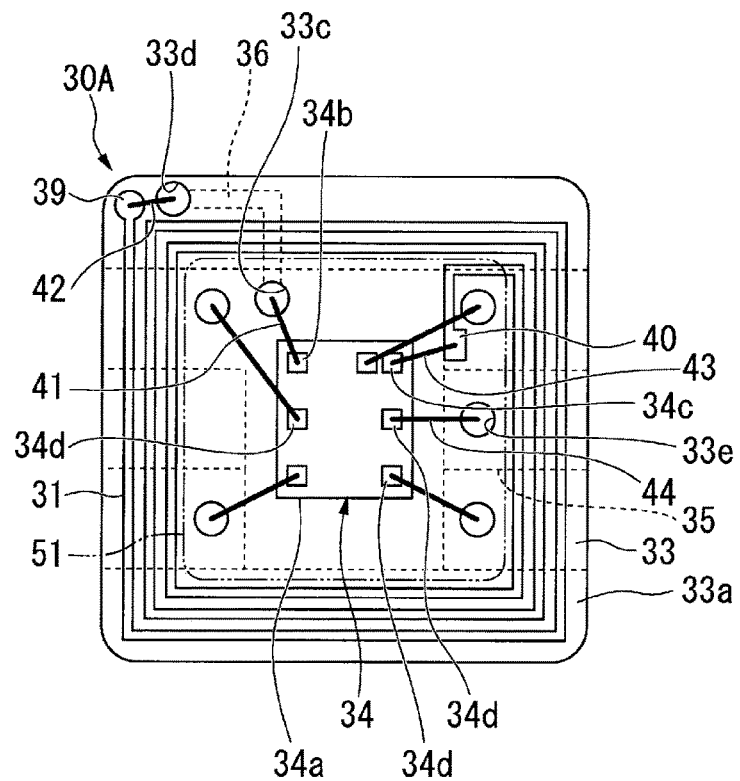
FIG. 7 is a bottom view illustrating the dual IC card according to the first modification of the embodiment of the present invention.

In the present embodiment, as in an IC module 30A illustrated in FIGS. 6 and 7, a resin seal 51 may be provided, in addition to the components of the IC module 30, to cover the IC chip 34, the first wire 41, the third wire 43, and the connecting wires 44. FIG. 7 illustrates, in a transparent manner, the resin seal 51 by a dash double-dotted line. The resin seal 51 may be formed of a known epoxy resin, for example.

By providing the IC module 30A with the resin seal 51, the IC chip 34 can be protected, and the wires 41 and 43 can be prevented from being disconnected.

At least part of the first through hole 33c may be ensured to be internally sealed by the resin seal 51. With this configuration, the wire 41 can be prevented from being detached or being disconnected. Further, the first through hole 33c may be entirely sealed by the resin seal 51.

Further, at least part of or the entire second through hole 33d may be internally sealed by the resin. With this configuration, the wire 42 can be prevented from being detached or being disconnected.

Figure 8:
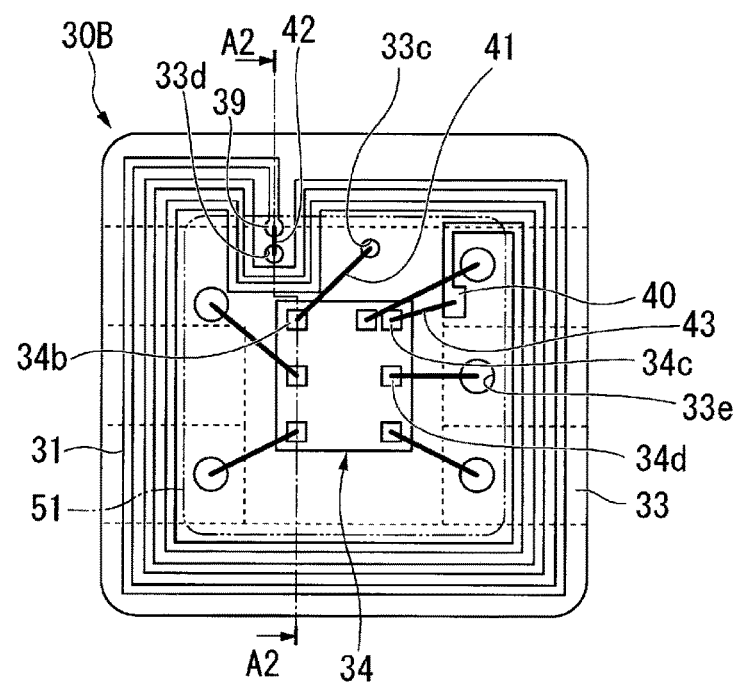
FIG. 8 is a bottom view illustrating a dual IC card according to a second modification of the embodiment of the present invention.
Figure 9:
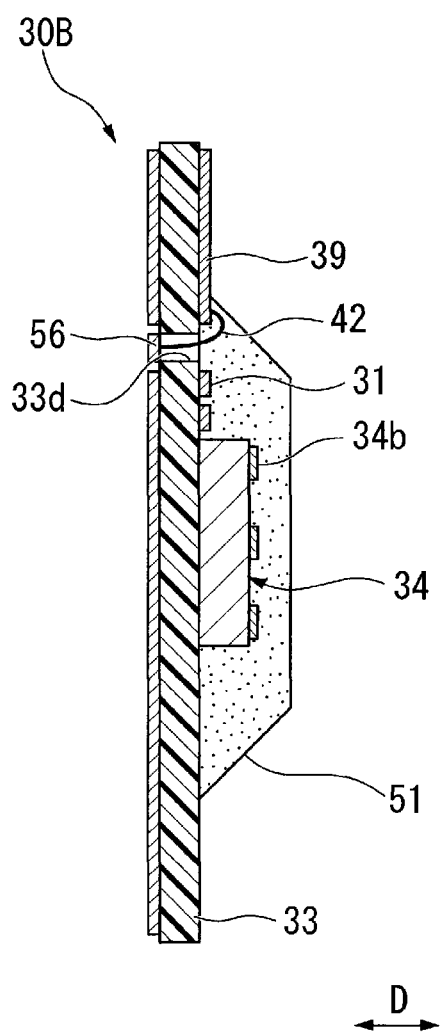
FIG. 9 is a cross-sectional view taken along a line A2-A2 of FIG. 8.
Figure 10:
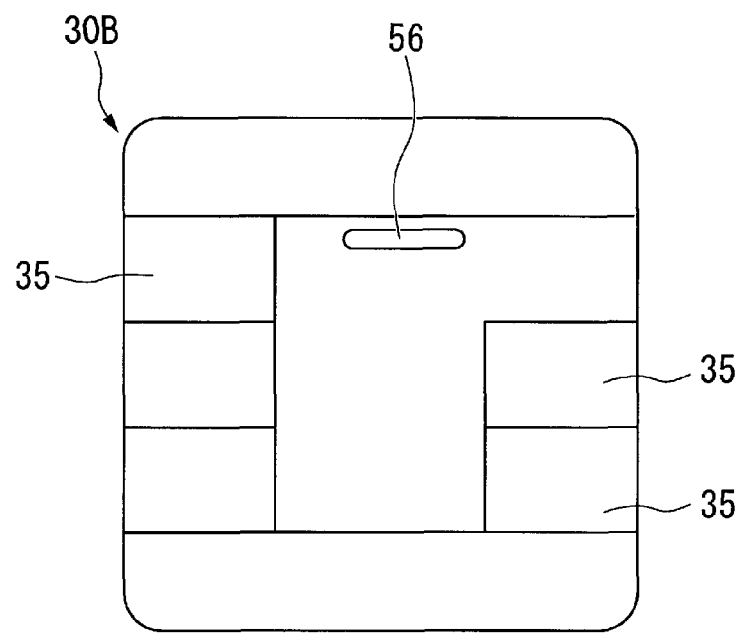
FIG. 10 is a plan view illustrating the dual IC card according to the second modification of the embodiment of the present invention.

As in an IC module 30B illustrated in FIGS. 8 to 10, part of the connecting coil 31 may be bent towards the IC chip 34 to arrange the second through hole 33d inside the inner perimeter of the connecting coil 31. Thus, the second wire 42 inserted through the second through hole 33d is ensured to be covered (sealed) with the resin seal 51 (see FIG. 9). In this case, all the through holes 33c, 33d, and 33e are covered with the resin seal 51. In this example, a bridge 56 is formed into a linear shape (see FIG. 10).

With such a configuration of the IC module 30B, the wires 41, 42, and 43 can be prevented from being disconnected.

At least part of the first and second through holes 33c and 33d may be internally sealed by the resin seal 51. With this configuration, the wires are prevented from being detached or being disconnected. Further, the first and second through holes 33c and 33d may be entirely sealed by the resin seal 51.

The size of the resin seal 51 is preferably small, as long as the resin seal 51 can cover the IC chip 34 as well as the wires 41, 42 and 43, and has a specific strength. The resin seal 51 does not have to be made so large as to cover the entire connecting coil 31.

The following description sets forth a method for manufacturing the IC module 30 configured as above.

Figure 11:
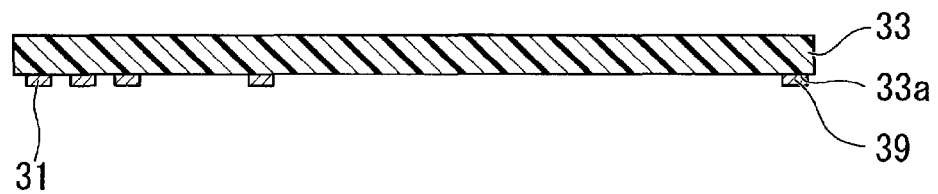
FIG. 11 is a cross-sectional view illustrating a method for manufacturing the IC module according to the embodiment of the present invention.

Firstly, as illustrated in FIG. 11, the connecting coil 31 and terminal portions 39 and 40 are formed on the first surface 33a of the module base 33 (the terminal portion 40 is not shown). The connecting coil 31 is formed, for example, by performing a known etching process with respect to a copper foil attached to the first surface 33a of the module base 33, followed by forming a specific pattern in in the copper foil.

Figure 12:
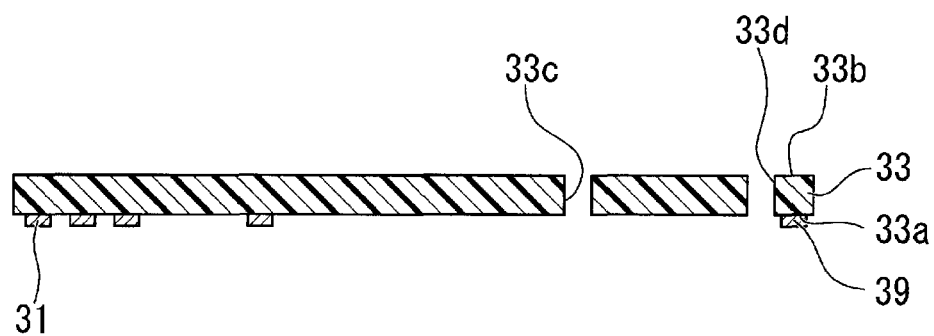
FIG. 12 is a cross-sectional view illustrating the method for manufacturing the IC module according to the embodiment of the present invention.

As illustrated in FIG. 12, in the area where the connecting coil 31 is not formed in the module base 33, the through holes 33c, 33d, and 33e (the through holes 33e are not shown) separated from each other are formed by, for example, performing a known punching process. The through holes 33c, 33d, and 33e may be formed firstly in the module base 33, followed by forming the connecting coil 31 on the module base 33.

Figure 13:
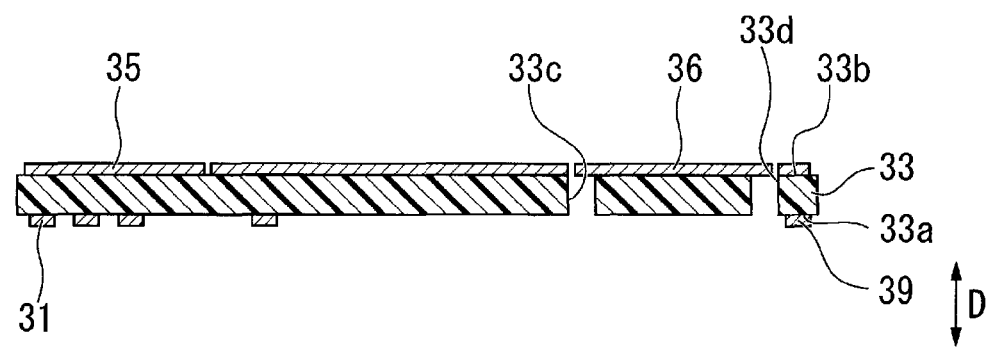
FIG. 13 is a cross-sectional view illustrating the method for manufacturing the IC module according to the embodiment of the present invention.

As illustrated in FIG. 13, the plurality of contact terminals 35 and the bridge 36 are formed on the second surface 33b of the module base 33. The contact terminals 35 and the bridge 36 are formed by laminating a copper foil on the second surface 33b of the module base 33, the copper foil being formed with the specific pattern in advance. The copper foil is positioned so that the bridge 36 overlaps with the through holes 33c and 33d as viewed in the thickness direction D.

Figure 14:
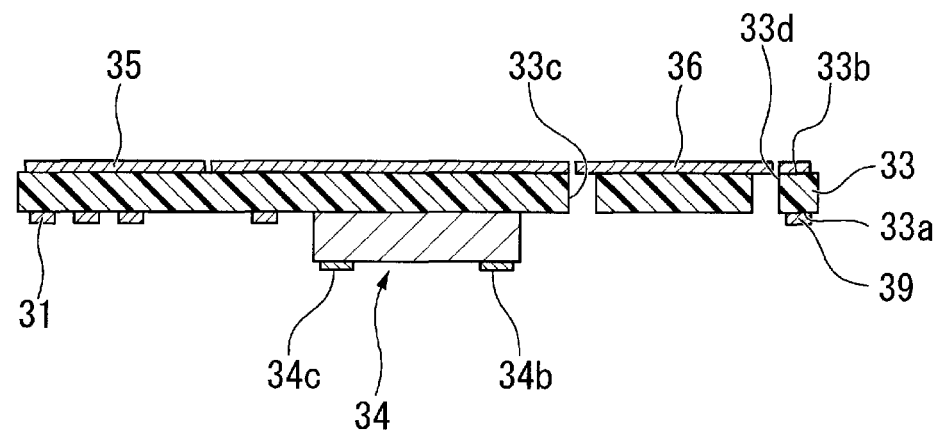
FIG. 14 is a cross-sectional view illustrating the method for manufacturing the IC module according to the embodiment of the present invention.

Then, as illustrated in FIG. 14, the IC chip 34 is mounted to the first surface 33a of the module base 33. In mounting the IC chip 34, a known die attach adhesive is favorably used.

As illustrated in FIGS. 4 and 5, the connecting coil 31, the IC chip 34, the plurality of contact terminals 35, and the bridge 36 are then connected by performing known hole-punching wire bonding or wire bonding using the wires 41, 42, 43, and 44. Specifically, the first terminal 34b of the IC chip 34 and the bridge 36 are connected via the first wire 41 inserted through the through hole 33c. The bridge 36 and the terminal portion 39 of the connecting coil 31 are connected via the second wire 42 inserted through the second through hole 33d. The terminal portion 40 of the connecting coil 31 and the second terminal 34c of the IC chip 34 are connected via the third wire 43.

In this case, the connection terminals 34d of the IC chip 34 and the contact terminals 35 are connected via the respective connecting wires 44 inserted through the through holes 33e.

The IC module 30 is manufactured by the above procedure.

The substrate 12 is subjected, for example, to etching which is based on a resist coating method performed by means of generally used gravure printing to thereby form the antenna 13, the capacitive element 14, and the like. The substrate 12, the antenna 13, and the capacitive element 14 are sandwiched between the pair of card bases 15, followed by integrating the pair of card bases 15 with each other by means of hot-press lamination or an adhesive. Then, the integrated body is punched into individual cards.

The recess 11 is formed in the card bases 15 by milling to thereby manufacture the card body 10.

As illustrated in FIG. 1, the card body 10 and the IC module 30 are connected by means of an adhesive, such as a hot melt sheet, not shown, so as to accommodate the IC chip 34 of the IC module 30 in the second accommodation portion 25 of the card body 10, thereby manufacturing the dual IC card 1.

In manufacturing the IC module 30B mentioned above, the IC chip 34 and the wires 41, 42, and 43 are sealed with a resin in a mold, not shown, to form the resin seal 51 that covers the IC chip 34 as well as the wires 41, 42, and 43.

Figure 15:
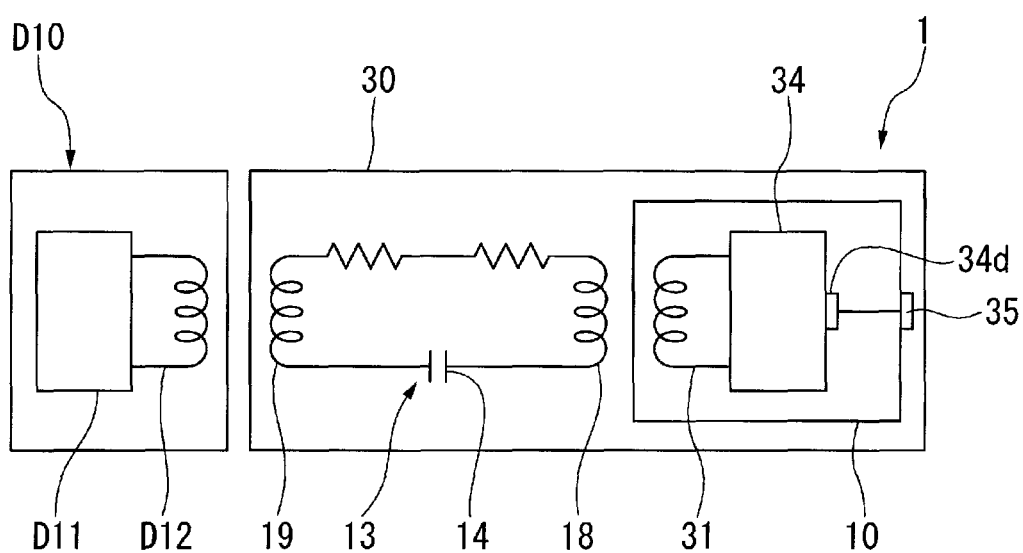
FIG. 15 is an equivalent circuit diagram illustrating the principle of the dual IC card according to the embodiment of the present invention.

Advantageous effects of the dual IC card 1 configured as above will be described. FIG. 15 is an equivalent circuit diagram illustrating the principle of the dual IC card 1.

A reader/writer (contactless external machine) D10 includes a transmitter/receiver circuit D11 which generates a high frequency signal, not shown. The high frequency signal induces a high frequency magnetic field in a transmitter/receiver coil D12. The high frequency magnetic field is emitted into a space as a magnetic energy.

In this case, when the dual IC card 1 is placed in the high frequency magnetic field, the high frequency magnetic field causes current to pass through a parallel resonant circuit which is configured by the antenna 13 and the capacitive element 14 of the dual IC card 1. In this case, current is also induced in the coupling coil 18 due to the high frequency magnetic field. However, the amount of current induced in the coupling coil 18 is smaller by at least one order of magnitude than the amount of current induced in the main coil 19. Accordingly, the reception sensitivity is greatly dependent on the characteristics of the main coil 19.

The signal received by the resonant circuit composed of the main coil 19 and the capacitive element 14 is transmitted to the coupling coil 18. Then, due to the electromagnetic coupling between the coupling coil 18 and the connecting coil 31, the signal is transmitted to the IC chip 34.

Although not shown, when power supply and communication are performed between the dual IC card 1 and an external contact machine such as an automatic teller machine, terminals provided to the automatic teller machine are brought into contact with the contact terminals 35 of the dual IC card 1. Then, power supply and communication are performed between a control unit of the automatic teller machine and the IC chip 34.

As described above, according to the IC module 30 and the method for manufacturing the IC module 30 of the present embodiment, a closed circuit is configured by performing hole-punching wire bonding or wire bonding without applying a through-hole plating process to the IC chip 34, the connecting coil 31 and the bridge 36, as well as the wires 41, 42, and 43. Accordingly, the module base 33 does not have to be subjected to plating in manufacturing the IC module 30, and thus the IC module 30 can be easily manufactured at low cost.

The IC chip 34 and the contact terminals 35 are connected by the connecting wires 44 which are inserted through the respective through holes 33e formed in the module base 33. By performing hole-punching wire bonding for the connection between the IC chip 34 and the contact terminals 35 as well, the IC module 30 can be manufactured at lower cost.

By covering the IC chip 34, the wires 41, 42 and 43 (first, second, and third conductive wires) with the resin seal 51, the IC chip 34 can be protected and also the wires 41, 42 and 43 can be prevented from being disconnected.

According to the dual IC card 1, the IC module 30 can be easily manufactured at low cost. Therefore, the dual IC card 1 including the IC module 30 as a whole can also be easily manufactured at low cost.

An embodiment of the present invention has been described so far in detail with reference to the drawings. However, specific configurations are not limited to the above embodiment. The present invention should include modifications and combinations of the configurations within a scope not departing from the spirit of the present invention.

For example, in the above embodiment, the main coil 19 and the connecting coil 31 are looped three times and the coupling coil 18 is looped five times. However, the number of times of looping these coils 18, 19, and 31 is not limited to the above, but these coils may be looped one or more number of times.

The number of contact terminals 35 included in the contact terminal portion does not have to be two or more but may be one.

In the above embodiment, the IC module 30 is provided in the dual IC card 1.

However, an object to be provided with the IC module 30 is not limited to this. For example, the IC module 30 may be provided to an inlet, or a booklet such as a passport. When the IC module 30 is provided to a back cover of a booklet, a recess is formed in the center of the back cover, a coupling coil is provided around the recess, and a main coil is provided on an edge portion of the back cover.

DESCRIPTION OF REFERENCE SIGNS

1 Dual IC card
10 Card body
11 Recess
13 Antenna
18 Coupling coil
19 Main coil
30, 30A, 30B IC module
31 Connecting coil
33 Module base (Base)
33a First surface
33b Second surface
33c First through hole
33d Second through hole
33e Through hole (Auxiliary through hole)
34 IC chip
34b First terminal
34c Second terminal
35 Contact terminal (Contact terminal portion)
36, 56 Bridge (Bridge wiring)
41 First wire (First conductive wire)
42 Second wire (Second conductive wire)
43 Third wire (Third conductive wire)
44 Connecting wire (Auxiliary conductive wire)
51 Resin seal
D Thickness direction
D10 Reader/writer

What is claimed is:
1. An IC module comprising:
   a sheet-like base having a first surface and a second surface and having a first through hole and a second through hole spaced apart from the first through hole;
   an IC chip provided to the first surface, having a contact communication function and a contactless communication function, and having a first terminal and a second terminal formed thereon;
   a connecting coil formed on the first surface and having a first end and a second end;
   a contact terminal portion provided to the second surface and configured to contact an external contact machine;
   bridge wiring provided to the second surface, provided at a position overlapping with the first through hole and the second through hole as viewed in a thickness direction of the base, and electrically insulated from the contact terminal portion;
   a first conductive wire inserted through the first through hole and connecting the first terminal of the IC chip to the bridge wiring;
   a second conductive wire inserted through the second through hole and connecting the bridge wiring to the first end of the connecting coil; and
   a third conductive wire connecting the second end of the connecting coil to the second terminal of the IC chip.

2. The IC module of claim 1, wherein the IC chip and the contact terminal portion are connected via an auxiliary conductive wire inserted through an auxiliary through hole formed in the base.

3. The IC module of claim 1, further comprising a resin seal covering the IC chip, the first conductive wire, the second conductive wire, and the third conductive wire.

4. A dual IC card comprising:
the IC module according to claim 1; and
a plate-like card body provided with an antenna having a coupling coil electromagnetically coupled to the connecting coil of the IC module, and a main coil connected to the coupling coil to perform contactless communication with an external contactless machine, the card body having a recess formed therein to accommodate the IC module.

5. A method for manufacturing an IC module, comprising:
preparing a sheet-like base having a first surface and a second surface;
forming a connecting coil on the first surface;
forming, in the base, a first through hole and a second through hole spaced apart from each other;
forming, on the second surface, a contact terminal portion configured to contact an external contact machine;
forming, on the second surface, bridge wiring electrically insulated from the contact terminal portion, the bridge wiring overlapping with the first through hole and the second through hole as viewed in a thickness direction of the base;
mounting, on the first surface of the base, an IC chip having a contact communication function and a contactless communication function;
connecting the first terminal of the IC chip to the bridge wiring via a first conductive wire inserted through the first through hole;
connecting the bridge wiring to a first end of the connecting coil via a second conductive wire inserted through the second through hole; and
connecting a second end of the connecting coil to the second terminal of the IC chip via a third conductive wire.

6. The method for manufacturing an IC module of claim 5, further comprising:
forming an auxiliary through hole in the base; and
connecting the IC chip to the contact terminal portion via an auxiliary conductive wire inserted through the auxiliary through hole.

7. The method for manufacturing an IC module of claim 5, further comprising covering the IC chip, the first conductive wire, the second conductive wire, and the third conductive wire with a resin seal.

* * * * *